(12) United States Patent
Haga et al.

(10) Patent No.: US 7,404,856 B2
(45) Date of Patent: Jul. 29, 2008

(54) NITROGEN-DOPED SILICON SUBSTANTIALLY FREE OF OXIDATION INDUCED STACKING FAULTS

(75) Inventors: Hiroyo Haga, Utsunomiya (JP); Takaaki Aoshima, Utsunomiya (JP); Mohsen Banan, Grover, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 11/623,142

(22) Filed: Jan. 15, 2007

(65) Prior Publication Data
US 2007/0169683 A1 Jul. 26, 2007

Related U.S. Application Data

(62) Division of application No. 10/380,806, filed as application No. PCT/US01/27049 on Aug. 30, 2001, now Pat. No. 7,182,809.

(60) Provisional application No. 60/308,521, filed on Jul. 27, 2001.

(30) Foreign Application Priority Data
Sep. 19, 2000 (JP) ............... 2000-283033

(51) Int. Cl.
*C30B 15/20* (2006.01)
(52) U.S. Cl. ............... 117/20; 117/13; 117/19; 117/937

(58) Field of Classification Search .............. 117/13, 117/19, 20, 937
See application file for complete search history.

(56) References Cited

U.S. PATENT DOCUMENTS

| 5,789,309 | A | 8/1998 | Hellwig |
| 5,919,302 | A | 7/1999 | Falster |
| 5,935,320 | A | 8/1999 | Graef |
| 6,228,164 | B1 | 5/2001 | Ammon |
| 6,843,847 | B1 | 1/2005 | Iida |
| 6,843,848 | B2 | 1/2005 | Von Ammon |
| 7,147,711 | B2 | 12/2006 | Tamatsuka |

FOREIGN PATENT DOCUMENTS

| EP | 0553677 B1 | 8/1993 |
| WO | 0224986 A1 | 3/2002 |

OTHER PUBLICATIONS

Abe, T., et al., "A History and Future of Silicon Crystal Growth", Silicon Materials Science and Technology, Proceedings of the Eighth International Symposium on Silicon Materials Science and Technology, Proceedings vol. 98-1, pp. 157-178.

(Continued)

*Primary Examiner*—Felisa Hiteshew
(74) *Attorney, Agent, or Firm*—Armstrong Teasdale LLP

(57) ABSTRACT

The present invention relates to a process for forming single crystal silicon ingots or wafers that contain an axially symmetric region in which vacancies are the predominant intrinsic point defect, that are substantially free of oxidation induced stacking faults, and are nitrogen doped to stabilize oxygen precipitation nuclei therein.

18 Claims, 4 Drawing Sheets

OTHER PUBLICATIONS

Adachi, N., et al., "Reduction of Grown-In Defects by High Temperature Annealing", Journal of The Electrochemcial Society, Jan. 2000, vol. 147, pp. 350-353.

Graf, D., et al., "Characterization of Crystal Quality by Crystal Originated Particle Delination and the Impact on the Silicon Wafer Survace", Journal of Electrochemical Society, vol. 145, No. 1, Jan. 1998, pts 275-284.

Shimura, F., et al., "Nitrogen Effect on Oxygen Precipitationin Czochralski Silicon", Appl. Phys. Letter 48 (3), Jan. 20, 1986, pp. 224-226.

Shimura, F., "Semiconductor Silicon Crystal Technology", Academic Press, Inc., 1989, pp. 116-121; 174-191; 191-195; 360-377.

Tamatsuka, M. et al., "Oxide Defect Annihilation/Generation Following High Temperature Annealing: A Gate Oxide Integrity Evaluation", Proceedings of the Sixth International Symposium on Ultralarge Scale Integration Science and Technology, Electrochemical Society Proceedings, vol. 97-3, pp. 183-194.

Yamagishi, H., "Recognition of D Defects in Silicon Single Crystals by Preferential Etching and Effect on Gate Oxide Integrity", Semiconductor Science and Technology, vol. 7, No. 1A, Jan. 1992, pp. A135-A140.

JP2000317385 abstract only, published Nov. 21, 2000, 1 pg.

Ilda et al., "Effects of Light Element Impurities on the Formation of Grown-in Defects Free Region of Czochralski Silicon Single Crystal" Electrochemical Society Proceedings, 99-1, pp. 499-510 (May 1999).

European Search Report from analogous application No. EP05107781 dated Oct. 5, 2007.

NITROGEN-DOPED SILICON SUBSTANTIALLY FREE OF OXIDATION INDUCED STACKING FAULTS

CROSS-REFERENCE TO RELATED APPLICATIONS

This application is a divisional of U.S. patent application Ser. No. 10/380,806 filed on Jul. 30, 2003 now U.S. Pat. No. 7,182,809, which claims priority from PCT application Ser. No. PCT/US501/27049 filed on Aug. 30, 2001, which claims priority from U.S. provisional application Ser. No. 60/308,521 filed on Jul. 27, 2001, which claims priority from Japanese application Serial No. 2000-283033 filed on Sep. 19, 2000, the entire disclosures which are incorporated herein by reference.

BACKGROUND OF THE INVENTION

The present invention relates generally to the preparation of semiconductor grade single crystal silicon which is used in the manufacture of electronic components. More particularly, the present invention relates to vacancy dominated single crystal silicon ingots and wafers that are doped with nitrogen to stabilize oxygen precipitation nuclei and are substantially free of oxidation induced stacking faults.

Single crystal silicon, from which a single crystal silicon wafer may be obtained, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter is typically reduced gradually to form an end-cone. Typically, the end-cone is formed by increasing the crystal pull rate and heat supplied to the crucible. When the diameter becomes small enough, the crystal is then separated from the melt.

It is now recognized that a number of defects in single crystal silicon form in the crystal growth chamber as the crystal cools after solidification. Such defects arise, in part, due to the presence of an excess (i.e., a concentration above the solubility limit) of intrinsic point defects, which are known as crystal lattice vacancies ("V") and silicon self-interstitials ("I"). The type and initial concentration of the intrinsic point defects are determined at the time of solidification and, if these concentrations reach a level of critical supersaturation in the system and the mobility of the point defects is sufficiently high, a reaction, or an agglomeration event, will likely occur. Agglomerated intrinsic point defects in silicon can severely impact the yield potential of the material in the production of complex and highly integrated circuits.

Agglomerated vacancy-type defects include such observable crystal defects as D-defects, Flow Pattern Defects (FPDs), Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. COPs are of particular interest because Gate Oxide Integrity failures correlate to the concentration of COPs on the wafer surface. D. Graf, M. Suhren, U. Schmilke, A. Ehlert, W. v. Ammon and P. Wagner., J. Electrochem. Soc. 1998, 145, 275; M. Tamatsuka, T. Sasaki, K. Hagimoto and G. A. Rozgonyi, Proc. 6th. Int. Symp. On Ultralarge Scale Integration Science and Technology "ULSI Science and Technology/1997," The Electrochemical Society 1997, PV 97-3, p. 183; and T. Abe, Electrochem. Soc. Proc. 1998, PV 98-1, 157; N. Adachi, T. Hisatomi, M. Sano, H. Tsuya, J. Electrochem. Soc. 2000, 147, 350. COPs within an ingot or wafer are octahedral voids. At the surface of a wafer, the COPs appear as pits with silicon dioxide covered walls and are typically about 50-300 nm wide and can be up to about 300 nm deep.

Also present in regions where vacancies are present but where agglomeration has not occurred, are defects which act as the nuclei for oxidation induced stacking faults (OISF). It is speculated that this particular defect, generally formed proximate the V/I boundary, is a high temperature nucleated oxygen precipitate catalyzed by the presence of the non-agglomerated vacancies ("free vacancies"); that is, it is speculated that this defect results from an interaction between oxygen and free vacancies in a region near the V/I boundary.

Defects relating to self-interstitials are less well studied. Agglomerated interstitial-type defects include B-defects which are generally regarded as interstitial clusters and I-defects which are generally regarded as dislocation loops or networks. Such defects are not responsible for gate oxide integrity failures, an important wafer performance criterion, but they are widely recognized to be the cause of other types of device failures usually associated with current leakage problems.

One approach to dealing with the problem of agglomerated intrinsic point defects includes growing the silicon crystal ingot at a high rate in an attempt to cause the ingot to be "vacancy dominated" (i.e., silicon wherein vacancies are the predominant intrinsic point defect) and then epitaxially depositing a thin crystalline layer of silicon on the surface of the vacancy dominated single crystal silicon wafer effectively filling or covering the agglomerated vacancy defects. The epitaxial deposition process typically involves a chemical vapor deposition process wherein a single crystal silicon wafer is rapidly heated to a temperature of about 1150° C. while a gaseous silicon compound is passed over the wafer surface to effect pyrolysis or decomposition. Although, this process provides a single crystal silicon wafer having a surface which is substantially free of agglomerated vacancy defects, it also annihilates oxygen precipitation nuclei formed during the growth of the ingot. Oxygen precipitation nuclei are necessary for the formation of oxygen precipitates during subsequent thermal processing associated with electronic device fabrication. The oxygen precipitates act as gettering sites for capturing metallic impurities in the bulk of the wafer and away from the surface. Without the ability to getter metallic impurities, the electronic properties of the wafer may be negatively impacted; for example, the wafer may have a decreased minority carrier lifetime, current leakage at p-n junctions, dielectric constant discontinuity and reduced breakdown strength.

One method for dealing with the problem of annihilating oxygen precipitation nuclei during epitaxial deposition is a lengthy thermal annealing process (e.g., about 4 hours at about 800° C. followed by 10 hours at about 1000° C.) to stabilize the oxygen precipitation nuclei against the rapid thermal epitaxial deposition process. This method decreases throughput and significantly increases the cost of manufacturing the silicon wafers.

A second method is to stabilize the oxygen precipitation nuclei with nitrogen doping of the silicon crystal (see, e.g., F. Shimura et al., Appl. Phys. Lett. 48 (3), p. 224, 1986). Specifically, F. Shimura et al. disclosed that the oxygen precipitation nuclei in a nitrogen doped crystal are stable up to about 1250° C. For example, nitrogen doping was recently reported to produce an epitaxial silicon wafer substrate with high gettering capability (see Japanese Patent Office Publication Number 1999-189493). However, the high gettering capability was due in part to the nearly uniform distribution of OISF throughout the wafer which negatively impacts the quality of the epitaxial wafer. Specifically, OISF on the surface of a silicon wafer, unlike other vacancy-type defects, are not covered by the deposition of an epitaxial silicon layer. OISF continue to grow through the epitaxial layer and result in grown-in defects commonly referred to as epitaxial stacking faults. Epitaxial stacking faults have a maximum cross-sectional width ranging from the current detection limit of a laser-based auto-inspection device of about 0.1 μm to greater than about 10 μm.

Accordingly, a need continues to exist for a process to grow a single crystal silicon ingot that comprises a portion or segment that is predominantly vacancy dominated and contains stabilized oxygen precipitation nuclei and is substantially free of OISF. Such an ingot segment would yield substrate wafers particularly suited for epitaxial deposition.

SUMMARY OF THE INVENTION

Among the objects and features of the present invention, therefore, is the provision of an epitaxial silicon wafer wherein the epitaxial layer is substantially free of defects associated with oxidation induced stacking faults; the provision of such a wafer wherein the substrate is doped with nitrogen; the provision of such a substrate wafer wherein vacancies are the predominant intrinsic point defect; and, the provision of such a substrate wafer which is substantially free of oxidation induced stacking faults. Further among the objects and features of the present invention is the provision of a process for preparing a single crystal silicon ingot, from which such a substrate wafer is obtained.

Briefly, therefore, the present invention is directed to a single crystal silicon ingot having a central axis, a seed end, an opposite end, and a constant diameter portion between the seed end and the opposite end having a lateral surface and a radius, R, extending from the central axis to the lateral surface, the single crystal silicon ingot being grown from a silicon melt and then cooled from the solidification in accordance with the Czochralski method. The single crystal silicon ingot being characterized in that the constant diameter portion comprises an axially symmetric region in which vacancies are the predominant intrinsic point defect, the axially symmetric region being generally cylindrical in shape and having a radius, $r_{as}$, extending from the central axis wherein $r_{as}$ is at least about 0.95 R, the axially symmetric region having a length as measured along the central axis of at least about 20% of the length of the constant diameter portion of the ingot. Also, the axially symmetric region comprises nitrogen at a concentration of about $1 \times 10^{13}$ atoms/cm$^3$ to about $1 \times 10^{15}$ atoms/cm$^3$ and oxygen at a concentration between about 7 ppma and about 10.5 ppma at about 5-6 mm inward of the lateral surface. The axially symmetric region is further characterized by being substantially free of nuclei which form oxidation induced stacking faults.

The present invention is further directed to a vacancy-dominated single crystal silicon ingot wherein the axially symmetric region comprises nitrogen at a concentration of about $1 \times 10^{13}$ atoms/cm$^3$ to about $1 \times 10^{15}$ atoms/cm$^3$. The axially symmetric region also comprises oxygen and the concentration at the central axis is $Oi_c$, the concentration of oxygen at about 5-6 mm inward of the lateral surface is $Oi_e$, and the radial gradient of oxygen concentration, ORG, given by the formula ORG=$(Oi_c-Oi_e)/Oi_c$ is at least about 15%.

The present invention is also directed to a single crystal silicon wafer that is vacancy-dominated and substantially free of oxidation induced stacking faults. The wafer comprises nitrogen at a concentration of about $1 \times 10^{13}$ atoms/cm$^3$ to about $1 \times 10^{15}$ atoms/cm$^3$. The wafer also comprises oxygen and the concentration of oxygen at about the circumferential edge is between about 7 ppma and 10.5 ppma.

The present invention is further directed to a vacancy-dominated single crystal silicon wafer that comprises nitrogen at a concentration of about $1 \times 10^{13}$ atoms/cm$^3$ to about $1 \times 10^{15}$ atoms/cm$^3$. The wafer also comprises oxygen and the concentration of oxygen at the central axis is $Oi_c$, the concentration of oxygen at the circumferential edge is $Oi_e$, and the radial gradient of oxygen concentration, ORG, given by the formula ORG=$(Oi_c-Oi_e)/Oi_c$ is at least about 15%.

Lastly, the present invention is directed to a process for growing a single crystal silicon ingot in which the ingot comprises a central axis, a seed end, an opposite end and a constant diameter portion between the seed end and the opposite end having a lateral surface, a radius, R, extending from the central axis to the lateral surface and a nominal diameter of about D mm, the ingot being grown from a silicon melt in a crucible and then cooled from the solidification temperature in accordance with the Czochralski method. The method comprising growing the constant diameter portion of the crystal at a rate, v, to cause the formation of an axially symmetrical region in which vacancies are the predominant intrinsic point defect, the axially symmetric region is generally cylindrical in shape and having a radius, $r_{as}$, extending from the central axis wherein $r_{as}$ is at least about 0.95 R and a length as measured along the central axis of at least about 20% of the length of the constant diameter portion of the ingot. The method also comprises rotating the crucible and the ingot in opposite directions during the formation of the axially symmetric region at rates $R_{melt}$ and $R_{ingot}$, respectively, to incorporate at least between about 7 ppma and about 10.5 ppma of oxygen at about the lateral surface. The method further comprises doping the silicon melt with nitrogen so that about $1 \times 10^{13}$ nitrogen atoms/cm$^3$ to about $1 \times 10^{15}$ nitrogen atoms/cm$^3$ are incorporated into the ingot during the formation of the axially symmetric region.

Other objects will be in part apparent and in part pointed out hereinafter.

DETAILED DESCRIPTION OF THE INVENTION

In accordance with the method of the present invention, a vacancy dominated single crystal silicon wafer substrate that comprises nitrogen-stabilized oxygen precipitation nuclei and is substantially free of oxidation induced stacking faults can be produced from low cost crystal (such as fast pull CZ or continuous pull CZ crystals). Specifically, the silicon wafer substrate is sliced from a nitrogen-doped single crystal silicon ingot with a controlled oxygen concentration distribution. The silicon wafer substrate is particularly suited for the deposition of an epitaxial silicon layer to produce a silicon wafer with a surface that is substantially free of agglomerated intrinsic point defects and epitaxial stacking faults, the substrate comprising stabilized oxygen precipitation nuclei that are resistant to dissolution during the epitaxial growth process. Thus, after a thermal treatment to grow the stabilized oxygen precipitation nuclei into oxygen precipitates, the epitaxial silicon wafer can intrinsically getter metallic impurities.

The starting point for producing the wafer of the present invention is the growth of the single silicon ingot from which the wafer is sliced. Growing a silicon ingot using the Czochralski method, as well as standard silicon slicing, lapping, etching, and polishing techniques, are well known in the art and disclosed, for example, in F. Shimura, Semiconductor Silicon Crystal Technology (Academic Press, 1989); and Silicon Chemical Etching, (J. Grabmaier, ed., Springer-Verlag, N.Y., 1982).

Figure 1:
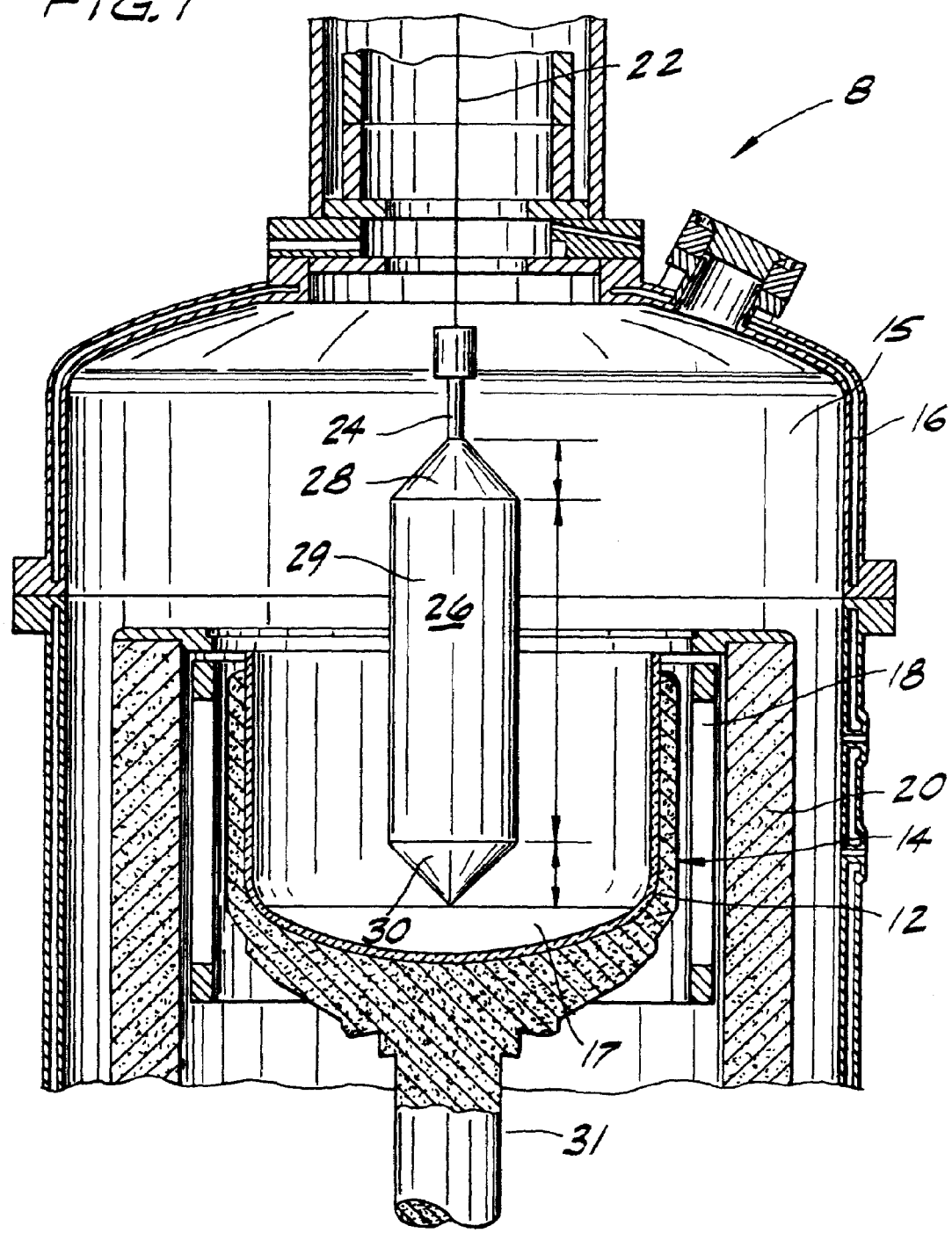
FIG. 1 is a cross-sectional view of a Czochralski growth apparatus.

Referring now to FIG. 1, there is shown a crystal pulling apparatus 8 for producing silicon single crystal ingots by the Czochralski method. The crystal pulling apparatus 8 includes a fused silica crucible 12 surrounded by a graphite susceptor 14 and contained within a water-cooled stainless steel growth chamber 16. The crucible 12 holds a polycrystalline silicon melt 17. The silicon melt is provided by adding solid polycrystalline silicon (not shown) to the crucible 12. The solid silicon is melted by heat provided from a heater 18 which surrounds the crucible 12. The heater 18 is surrounded by insulation 20 to retain the heat within the crucible.

A crystal pulling shaft or wire 22 supporting a monocrystalline silicon seed 24 at its lower end is positioned above the silicon melt 17. As the seed crystal is lowered into the molten silicon 17, the seed begins to melt. After thermal equilibration, the pulling wire 22 is then retracted withdrawing the seed 24 from the molten silicon 17. As the seed 24 is withdrawn, the liquid silicon from the melt solidifies around the seed in a single crystal above the melt 17. The pulling wire 22 from which the formed single crystal is suspended is continuously retracted from the melt as it rotates, forming a substantially cylindrical crystal 26 as in a conventional Czochralski process. The pull rate is decreased creating an outwardly flaring region or seed end 28 typically referred to as the cone of the crystal. When the desired diameter is obtained, the pull rate and other growth conditions are controlled to provide a substantially constant diameter portion 29 between the seed end 28 and the opposite end 30 of the crystal 26.

While the single crystal 26 is being pulled, the crucible 12 is rotated via a shaft 31 in a direction opposite that of the crystal 26. As the single crystal 26 grows, the crucible 12 is raised within the growth chamber 15 to compensate for depletion of the silicon melt 16. When the melt is nearly depleted, the process variables are typically adjusted to decrease the crystal diameter resulting in the formation of the opposite end 30 of the crystal 26. Once the diameter of the opposite end 30 is sufficiently small, generally 2 mm to 4 mm, detachment of the crystal 26 from the silicon melt can be accomplished without causing dislocations to spread to the main body of the crystal. The single crystal ingot 26 is then removed from the growth chamber 15 and processed to form silicon wafers.

Vacancy-Rich Silicon Ingot

Figure 2:
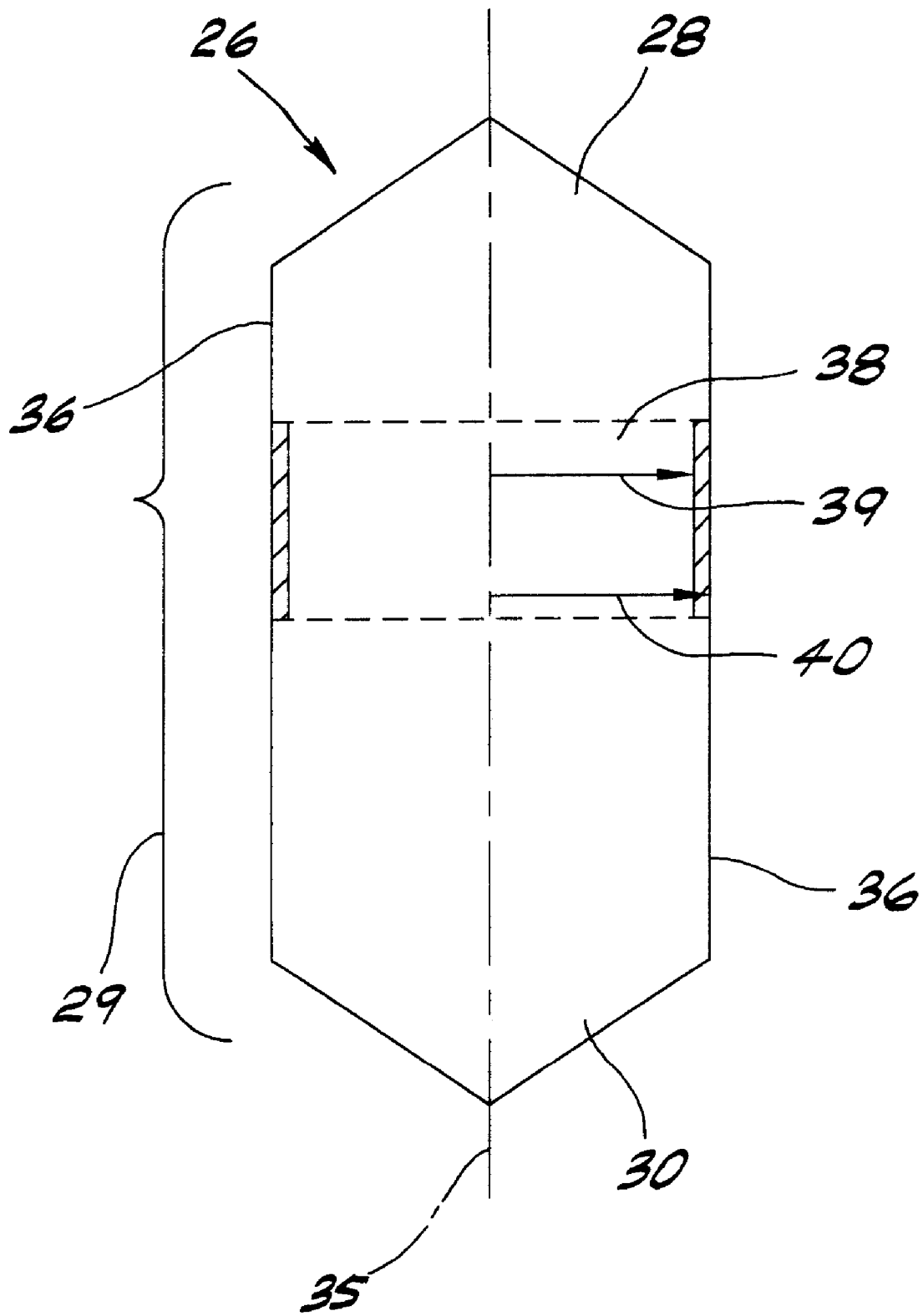
FIG. 2 is a longitudinal, cross-sectional view of a single crystal silicon ingot, in detail, an axially symmetric region of a constant diameter portion of the ingot.

Referring to FIG. 2, the constant diameter portion 29 of single crystal silicon comprises a lateral surface 36 and a radius 40 extending from a central axis 35 to the lateral surface 36. In accordance with the present invention, the silicon ingot 26 is referred to as "vacancy rich" and comprises an axially symmetric region of vacancy dominated material 38 that is generally cylindrical having a radius 39 that preferably corresponds to about that of the constant diameter portion (i.e., at least about 95% of the radius 40 of the constant diameter portion 29). Vacancies preferably extend from the axis to about the lateral surface because they are necessary to form oxygen precipitation nuclei and preferably the ingot has oxygen precipitation nuclei from the center to about the lateral surface so that gettering precipitates may be subsequently grown from the center to about the lateral surface.

A vacancy-rich silicon ingot is typically formed by growing or pulling the crystal at a relatively fast rate (e.g., a pull rate of at least about 0.7-0.8 mm/min). However, the formation of vacancies does not depend entirely on the crystal pull rate; the axial temperature gradient ($G_0$) in the crystal during the growth process is also significant (see, e.g., U.S. Pat. No. 5,919,302 which is herein incorporated by reference and wherein it is disclosed that for vacancies to be from center to the lateral surface the ratio of $v/G_0$ is greater than the critical value over the entire radius of the crystal). In general, increasing the rate at which a silicon ingot is pulled increases the density of vacancies which, upon the occurrence of the agglomeration event, increases the number of agglomerated vacancy defects and decreases the size of the agglomerated vacancy defects. The average density of agglomerated defects in fast pull vacancy-rich ingot and wafers sliced therefrom may be about $1\times10^3/cm^3$ to about $1\times10^7/cm^3$ and is typically about $1\times10^5/cm^3$ to about $1\times10^6/cm^3$.

The trend in the semiconductor industry is toward larger diameter semiconductor wafers (e.g., wafer diameters of 150 mm, 200 mm and 300 mm are commonly produced); as the diameter increases, however, the maximum pull rate typically decreases. Currently, vacancy dominated silicon ingots with a nominal diameter as great as about 300 mm can be grown by pulling the crystal at a rate of at least about 0.7 mm/min. Vacancy dominated silicon ingots with a nominal diameter less than about 300 mm (e.g., 150 mm and 200 mm) can be readily grown at a rate greater than 0.7 mm/min, and are preferably grown at a rate of at least about 0.9-1.0 mm/min. Most preferably, the ingot is grown at the fastest possible rate for the desired nominal diameter. Growing the ingot at the fastest possible rate provides several benefits including, maximizing the width of the vacancy dominated region of the ingot which preferably extends from the central axis to the lateral surface, increasing the throughput of the crystal growing apparatus and decreasing the cost of the wafers.

The ingot may contain one or more dopants to give the wafers sliced therefrom desired electrical properties. For example, the ingot may be a p-type ingot (i.e., an ingot that has been doped with an element from Group 3 of the Periodic Table such as boron, aluminum, gallium and indium, most typically boron) or an n-type ingot (i.e., an inogt that has been doped with an element from Group 5 of the Periodic Table such as phosphorus, arsenic, antimony, most typically phosphorus). Preferably, the ingot is a p-type ingot and wafers sliced therefrom have a resistivity of from about 100 Ω·cm to about 0.005 Ω·cm. For boron doped silicon, the foregoing resistivity values correspond to a dopant concentration of about $3\times10^{17}$ atoms/cm$^3$ to about $3\times10^{19}$ atoms/cm$^3$, respectively. More preferably, it is a p-type ingot having a resistivity of about 20 Ω·cm to about 1 Ω·cm (generally referred to as p⁻-silicon). Still more preferably, the ingot has a resistivity of about 12 Ω·cm to about 8 Ω·cm.

In addition to vacancies, a single crystal silicon ingot prepared using the Czochralski method contains oxygen. A Czochralski grown ingot may have an average oxygen concentration ranging from about $5 \times 10^{17}$ atoms/cm³ to about $9 \times 10^{17}$ atoms/cm³ (in other words, from about 10 ppma to about 18 ppma, ASTM standard F-121-80), and typically has an average oxygen concentration ranging from about $6 \times 10^{17}$ atoms/cm³ to about $8.5 \times 10^{17}$ atoms/cm³ (i.e., from about 12 ppma to about 17 ppma).

Nitrogen-Stabilized Oxygen Precipitation Nuclei

In accordance with the method of the present invention, the silicon crystal of the present invention comprises nitrogen dopant atoms to stabilize the oxygen precipitation nuclei in the ingot. The concentration of nitrogen in the silicon crystal is preferably about $1 \times 10^{13}$ atoms/cm³ (about 0.0002 ppma) to about $1 \times 10^{15}$ atoms/cm³ (about 0.02 ppma).

The ingot may be doped with nitrogen by several methods including, for example, introducing nitrogen gas into the growth chamber and/or adding nitrogen to the polysilicon melt. The amount of nitrogen being added to the growing crystal is more precisely controlled by adding the nitrogen to the polysilicon melt, as such, it is the preferred method. Specifically, the amount of nitrogen added to the crystal is readily determined, for example, by depositing a layer of silicon nitride ($Si_3N_4$) of a known thickness on silicon wafers of a known diameter which are introduced into the crucible with the polysilicon prior to forming the silicon melt (the density of $Si_3N_4$ is about 3.18 g/cm³).

Without being held to a particular theory, it is presently believed that the nitrogen dopant atoms thermally stabilize the oxygen precipitation nuclei by retarding the diffusion of the vacancies in the silicon crystal. Specifically, it is known that as the growing crystal cools the concentration of vacancies reaches a level of critical supersaturation (i.e., at which point an agglomeration event occurs) which results in the formation of agglomerated vacancy defects or micro-voids. For example, the supersaturation of may occur at a temperature of about 1150-1050° C. As the crystal cools, the micro-voids grow in size because vacancies continue to diffuse to the sites. Although the agglomeration event and continued growth of the micro-voids significantly reduces the concentration of non-agglomerated, or "free," vacancies in the crystal, upon continued cooling a second level of critical supersaturation is reached in which the free vacancies and oxygen in the crystal interact to form oxygen precipitation nuclei. For a non-nitrogen doped crystal, the second level of critical supersaturation occurs as the crystal cools below about 700° C. In nitrogen doped silicon, however, the formation of micro-voids during the agglomeration event is slightly suppressed due to the slower diffusion rate of the vacancies. This results in a higher concentration of free vacancies remaining in the crystal after the first agglomeration event. The increased concentration of free vacancies in the nitrogen doped silicon increases the temperature at which the second level of critical supersaturation occurs, e.g., at about 800° C. to about 1050° C. At the increased temperature, the oxygen atoms in the crystal are more mobile and more oxygen atoms interact with the free vacancies which results in oxygen precipitation nuclei which are more stable. The stabilized oxygen precipitation nuclei are more resistant to dissolution during subsequent thermal processing such as the growth of an epitaxial silicon layer.

Intrinsic Gettering Silicon Substantially Free of Oxidation Induced Stacking Faults As described above, the grown single crystal silicon ingot may comprise defects which act as the nuclei for oxidation induced stacking faults (OISF) within the silicon. Upon being thermally treated during the manufacture of silicon wafers sliced from the ingot, the nuclei can grow and form OISF in the crystal that are typically concentrated within a ring-like region. The density of OISF is largely dependent on the concentrations of oxygen and free vacancies both of which vary axially and radially throughout the ingot. Thus, the density of OISF visible on the surface of a wafer will vary as a function of radial distance.

The location of the OISF ring is primarily dependent upon the growth rate of the crystal. In fact, one approach to eliminating the presence of oxidation induced stacking faults, or the OISF ring, in silicon wafers is to control the growth conditions of a single crystal silicon ingot, from which the wafers are obtained, such that the OISF ring is "pushed" or extended out past the lateral surface of the ingot. This can typically be achieved by simply growing the ingot at a high rate, such that vacancies are the predominant intrinsic point defect. The presence of vacancy defects is not believed to be narrowly critical, because the epitaxial deposition process acts to fill any pits or voids present at the wafer surface caused by these vacancies. However, as ingot diameters continue to increase, achieving and/or maintaining a growth rate over a significant portion of the ingot main body, such that OISF are not present, can be difficult if not impossible. Additionally, as previously noted, it has been discovered that the introduction of nitrogen dopant atoms to the silicon melt (e.g., more than about $1 \times 10^{13}$ atoms/cm³) further complicates matters by increasing the width of the OISF ring such that conventional crystal growth processes cannot eliminate the OISF ring (especially the H-band) from large diameter crystals (i.e., 150 mm, 200 mm, 300 mm or more).

It has been discovered that in order to produce a vacancy-rich ingot with nitrogen-stabilized oxygen precipitation nuclei that is substantially free of OISF and has a concentration of oxygen precipitates sufficient for intrinsic gettering purposes (from the axis to about the lateral surface), the fast growth process is controlled so that the oxygen concentration about 5-6 mm inward of the lateral surface, $Oi_e$, is between about 7 ppma and about 10.5 ppma as measured in accordance with ASTM standard F-121-83. As used herein, substantially free of oxidation induced stacking faults describes silicon: (a) that has no discernable ring of oxidation induced stacking faults which when subjected to the methods of visually detecting agglomerated defects set forth below; and/or (b) that has a concentration of oxidation induced stacking faults that is less than about 10 per cm² when inspected with a laser-based auto-inspection device set to detect a maximum cross-sectional width ranging from about 0.1 microns to greater than about 10 microns.

Substantially Uniform Concentration of Oxygen Precipitates

In general, the concentration of oxygen in Czochralski grown silicon decreases from the central axis to the lateral surface due to the loss of oxygen around the meniscus at the crystal/melt interface. It has been considered necessary to limit or suppress the decrease in oxygen concentration approaching the lateral surface as much as possible to produce silicon ingots with a uniform oxygen precipitation profile. Accordingly, in conventional silicon ingots, the difference in the oxygen concentration at the center or axis of the ingot, $Oi_c$, and the oxygen concentration near the lateral surface, $Oi_e$, referred to as the radial gradient of oxygen concentration, ORG, is substantially uniform (e.g., the ORG=($Oi_c$−$Oi_e$)/$Oi_c$<about 10%).

It has been discovered that, despite maintaining the concentration of oxygen substantially uniform over radius of the ingot, the concentration of subsequently formed oxygen precipitates increases near the lateral surface in nitrogen doped crystals. This is problematic because the elevated concentration of oxygen precipitates may cause a deformation slip and the lateral surface is a particularly susceptible position of the wafer for a deformation slip to begin. It is presently believed that the increase in oxygen precipitates near the lateral surface in nitrogen doped crystals is due to the H-band remaining near the lateral surface despite pulling the crystal at a fast rate. In this case, contrary to accepted wisdom, reducing the radial nonuniformity in the concentration of oxygen (ORG) actually causes nonuniformity in the concentration of subsequently formed oxygen precipitates. It has also been discovered that nitrogen doping exacerbates the nonuniformity. Specifically, a nitrogen doped crystal with a substantially uniform radial concentration of oxygen (ORG less than about 10%) has an oxygen precipitate profile that is more nonuniform than that of a non-nitrogen doped crystal. To improve the radial uniformity of the oxygen precipitates in accordance with the present invention, the concentration of oxygen as a function of increasing radial distance is substantially nonuniform (e.g., the ORG is at least about 15%). Preferably, the ORG is about 15% to about 50%, more preferably about 20% to about 40% and still more preferably about 30%.

As mentioned above, an oxygen concentration between about 7 ppma and about 10.5 ppma at about the lateral surface is preferred to prevent the formation of OISF. Thus, a crystal with an ORG of at least about 15% will have a concentration at the center (axis), $Oi_c$, of at least about 8-12 ppma. Preferably, the $Oi_c$ is about 10 ppma to about 16 ppma, more preferably about 12 ppma to about 15 ppma and even more preferably about 12.5 ppma to about 14.5 ppma.

Controlling the Incorporation of Oxygen

The silicon crystal ingot of the present invention is produced by controlling the incorporation of oxygen into the growing ingot (e.g., the average oxygen concentration and radial distribution of the oxygen concentration). The incorporation of oxygen is primarily controlled by controlling the rates of rotation for the crucible and the crystal.

The primary source of oxygen in the crystal is the fused silica crucible which introduces oxygen into the silicon melt. The total amount of oxygen incorporated into the growing crystal is primarily dependent upon the rotation rate of the crucible, $R_{melt}$. In general, increasing the crucible rotation rate increases the amount of oxygen incorporated in the growing crystal. A crucible rate of at least about 2-3 rpm is necessary to avoid turbulent convection flows in the melt. Preferably the crucible rotation rate is about 4 rpm to about 10 rpm and more preferably about 5 rpm to about 8 rpm.

Figure 3:
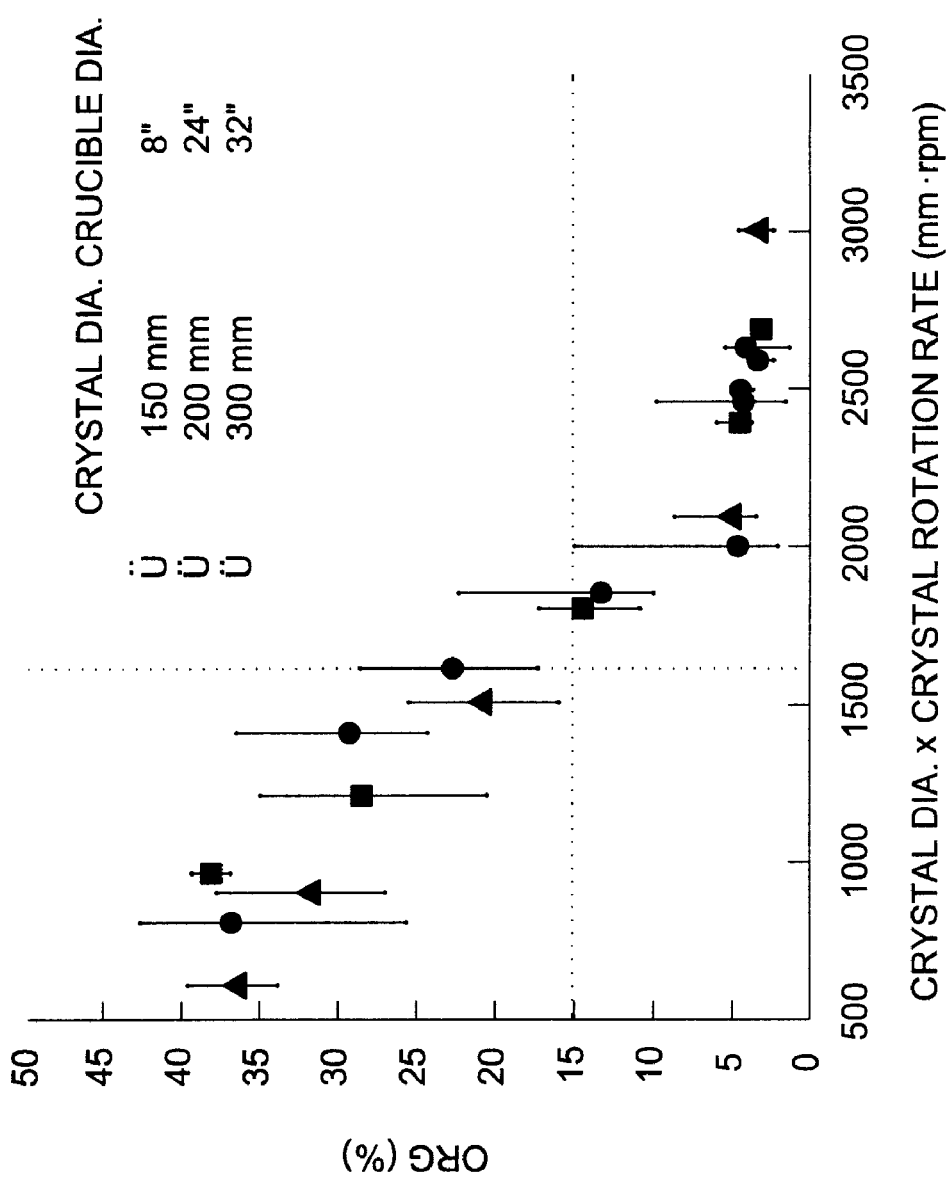
FIG. 3 is a graph which shows the relationship between crystal rotation rate, crystal diameter and radial oxygen concentration.

The rotation rate of the crystal, $R_{ingot}$, is the primary means of controlling the radial distribution of oxygen in the growing crystal. Rotating the growing crystal induces flows in the melt which rise from the bottom of the ingot near the center of the crucible and outward toward the inside wall of the crucible (or the lateral surface of the crystal). Near the bottom of the crucible, the melt contains a higher concentration of oxygen compared to the surface of the melt so the flows carry oxygen from the bottom toward the melt/crystal interface and the oxygen is incorporated into the growing crystal. Increasing the crystal rotation rate increases the radial distance of the high oxygen flow near the surface of the melt which increases the radial uniformity of the oxygen in the ingot. As such, conventional growing methods which attempt to enhance the radial uniformity of the oxygen concentration rotate the crystal at a relatively high rate (e.g., greater than about 2000/D revolutions per minute (rpm) where D is the diameter of the crystal in millimeters). In contrast, in accordance with the present invention the crystal rotation rate is controlled to produce a substantially nonuniform radial oxygen concentration. Specifically, crystal rotation rate is controlled such that the ORG is greater than about 15%, preferably about 15% to about 50%, more preferably about 20% to about 40% and still more preferably about 30%. Referring to FIG. 3, it has been determined that the substantially nonuniform radial oxygen concentration (i.e., an ORG that is greater than about 15%) is achieved by controlling the crystal rotation rate such that it is less than about 1600/D rpm. Preferably the rotation rate of the crystal is about 600/D rpm to about 1600/D rpm, more preferably about 750/D rpm to about 1500/D rpm and even more preferably about 1200/D rpm.

Wafer Substrate

Figure 4:
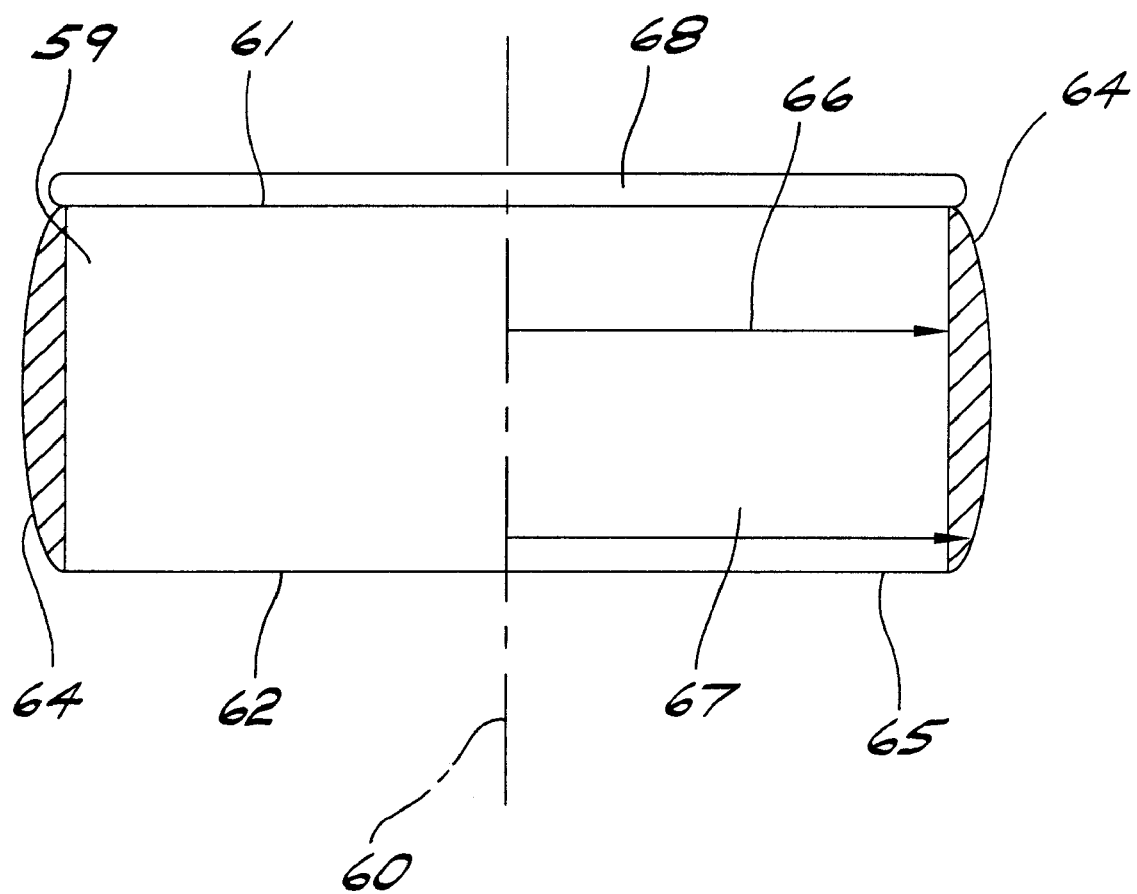
FIG. 4 is a cross-sectional view of an epitaxial single crystal silicon wafer (not to scale).

Referring to FIG. 4, a single crystal silicon wafer substrate 59 sliced from the axially symmetric region of vacancy dominated material of the silicon ingot as described herein (a "vacancy-rich wafer substrate") comprises a central axis 60, a front surface 61, and a back surface 62 which are generally perpendicular to the central axis 60, a circumferential edge 64 joining the front surface 61 and the back surface 62, a radius 65 extending from the central axis 60 to the circumferential edge 64 and an axially symmetric region of vacancy dominated material 67 that is generally cylindrical having a radius 66 that preferably extends from the central axis 60 to about the circumferential edge 64 (i.e., at least about 95% of the radius 65).

Anomalies on the surface of the silicon wafer, regardless of whether they are particles (e.g., polishing grit), agglomerated interstitial defects, or agglomerated vacancy defects (e.g., COPs) are typically detected with laser scatter inspection tools. Examples of suitable commercially available laser scatter inspection tools include the SURFSCAN 6220 and the SURFSCAN SP1 from KLA-Tencor (Mountain View, Calif., U.S.A.) and the CR80, CR81 and CR82 from ADE Optical Systems Corp (Charlotte, N.C., U.S.A.). Such tools can determine the size and location of defects on the silicon wafer surface (commonly referred to as LPDs). It is well known in the art that when measuring the size of LPDs on the surface of a wafer using a laser scatter inspection tool, the actual size of the LPD is not determined, rather the detected defect (i.e., light scattering event) scatters light equivalent to a latex sphere (LSE) of a particular diameter (e.g., a latex sphere with a diameter larger than about 0.095 μm which is the current detection limit for laser scatter inspection tools such as the SURFSCAN 6220 and the SURFSCAN SP1). The vacancy-rich wafer typically has a concentration of LPDs on the front surface of the wafer that is greater than about 8 LPDs/cm².

Epitaxial Silicon Layer

Referring again to FIG. 4, an epitaxial layer 68 may be deposited or grown on the front surface 61 of the wafer substrate 59 by means known in the art. (See, e.g., U.S. Pat. No. 5,789,309.) Typically, growth of the epitaxial layer is achieved by chemical vapor deposition because this is one of the most flexible and cost efficient methods for growing epitaxial layers on semiconductor material. Generally speaking, chemical vapor deposition involves the introduction of volatile reactants (e.g., $SiCl_4$, $SiHCl_3$, $SiH_2Cl_2$ or $SiH_4$) with a carrier gas (usually hydrogen) into an epitaxial reactor. Although process conditions may vary, in the case of monocrystalline layer deposition the temperature will generally range between 1080° C. and 1150° C. In addition, the environment in which the deposition occurs is preferably clean (i.e., free of particulate contaminants) and has an oxygen content below about 1 ppma.

In accordance with the present invention, experience to-date suggests that it is desirable to utilize a nitrogen-doped single crystal silicon substrate which is substantially free of oxidation induced stacking faults. Such a substrate is desirable because, during deposition, silicon material being deposited on the wafer surface tends to accumulate more rapidly at the sites of these stacking faults, as compared to the flat surface surrounding them. The deposition and accumulation of silicon material at these defect sites result in the formation of grown-in defects, i.e. hillocks or stacking faults, within the epitaxial layer. Of particular concern are large area grown-in defects which have a diameter greater than or equal to about 10 μm, as measured by laser beam surface scanning equipment common in the art such as the SURFSCAN 6220.

Without being held to any particular theory, it is generally believed that defects in the epitaxial layer may result from a number of different causes. For example, particulate and other organic contaminants present on the substrate surface may, along with oxidation induced stacking faults, act as sites for silicon material to accumulate during deposition. Accordingly, the present invention may be utilized in conjunction with other means, such as improved methods of substrate cleaning and handling, in an effort to fully eliminate defects within the epitaxial layer. However, if employed alone, the present invention effectively acts to eliminate a significant cause of epitaxial layer defects and, therefore, reduces the overall concentration of such defects.

Furthermore, it is also generally believed that the presence of agglomerated vacancy defects, also referred to as voids, at the surface of the substrate is not narrowly critical to the production of an epitaxial layer which is substantially free of grown-in defects. Rather, it is believed that as silicon material is deposited upon the substrate surface these voids are effectively covered or "filled." As a result, agglomerated vacancy defects are not propagated through the epitaxial layer. However, to ensure voids or "pits" are not present in the epitaxial layer surface, the epitaxial layer will generally have a thickness sufficient to cover the agglomerated vacancy defects present on the surface of the substrate, the thickness increasing as the size or depth of such defects increases. Typically, the thickness of the layer ranges from at least about 1 μm up to about 15 μm or more. Preferably, the epitaxial layer will have a thickness ranging from about 1 μm to about 10 μm, more preferably from about 1 μm to about 8 μm, and most preferably from about 1 μm to about 4 μm. In this regard it is to be noted that a thinner layer is usually preferred, provided agglomerated vacancy defects are effectively covered, because it acts to reduce the cost of the resulting epitaxial wafer. The concentration of LPDs on the epitaxial surface is preferably reduced to less than about 1 LPD/cm$^2$, more preferably less than about 0.5 LPDs/cm$^2$, still more preferably less than about 0.1 LPDs/cm$^2$ and even more preferably less than about 0.05 LPDs/cm$^2$.

Visual Detection of Agglomerated Defects

Agglomerated defects may be detected by a number of different techniques. For example, flow pattern defects, or D-defects, are typically detected by preferentially etching the single crystal silicon sample in a Secco etch solution for about 30 minutes, and then subjecting the sample to microscopic inspection. (see, e.g., H. Yamagishi et al., Semicond. Sci. Technol. 7, A135 (1992)). Although standard for the detection of agglomerated vacancy defects, this process may also be used to detect agglomerated interstitial defects. When this technique is used, such defects appear as large pits on the surface of the sample when present.

Agglomerated defects may also be detected using laser scattering techniques, such as laser scattering tomography, which typically have a lower defect density detection limit than other etching techniques.

Additionally, agglomerated intrinsic point defects may be visually detected by decorating these defects with a metal capable of diffusing into the single crystal silicon matrix upon the application of heat. Specifically, single crystal silicon samples, such as wafers, slugs or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat treated sample is then cooled to room temperature, thus causing the metal to become critically supersaturated and precipitate at sites within the sample matrix at which defects are present.

After cooling, the sample is first subjected to a non-defect delineating etch, in order to remove surface residue and precipitants, by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

In general, regions of interstitial and vacancy dominated material free of agglomerated defects can be distinguished from each other and from material containing agglomerated defects by the copper decoration technique described above. Regions of defect-free interstitial dominated material contain no decorated features revealed by the etching whereas regions of defect-free vacancy dominated material (prior to a high-temperature oxygen nuclei dissolution treatment as described above) contain small etch pits due to copper decoration of the oxygen nuclei.

Further, oxidation induced stacking faults may be visually detected on the surface of a silicon wafer substrate or epitaxial silicon wafer by wet oxidizing the silicon. Specifically, the silicon is wet oxidized for about 1 to 2.5 hours at about 1100 to 1150° C. The wet oxidation creates an oxide layer of about 1 μm thick on the wafer surface. The oxide layer is stripped from the silicon surface using a Wright etch. The wafer is rinsed, dried and then viewed under a microscope for the presence of a ring of oxidation induced stacking faults or is inspected using a laser-based surface inspector. As used herein, substantially free of oxidation induced stacking faults describes silicon: (a) that has no discernable ring of oxidation induced stacking faults when subjected to the above visual detection method; or (b) that has an average concentration of oxidation induced stacking faults that is less than about 10 per cm$^2$ when inspected with a laser-based auto-inspection device set to detect a maximum cross-sectional width ranging from about 0.1 microns to greater than about 10 microns.

EXAMPLES

Example 1

A p⁻-type single crystal ingot having a diameter of 200 mm and {100} crystallographic orientation was pulled from a 24 inch crucible containing about 140 kg of polysilicon and about 320 mg of silicon nitride. The pulling rate was about 1.0 mm/min. The crucible rotation rate was controlled to between about 5 rpm near the seed end of the ingot to about 8 rpm near the tail end of the ingot to yield an oxygen concentration of about 13±0.5 ppma at the center of the crystal ($Oi_c$). The crystal rotation rate was about 6 rpm and the oxygen concentration over the length of the constant diameter portion at 6 mm from the edge was between about 10.4 ppma to about 9.3 ppma. The radial gradient of oxygen concentration distribution was about 20% to about 40%. The target nitrogen concentration at the top of the ingot was about $6 \times 10^{13}$ atoms/cm³. The target nitrogen concentration at the bottom of the ingot was about $22 \times 10^{13}$ atoms/cm³. Due to the very low distribution coefficient of nitrogen in the silicon melt (about 0.0007), the nitrogen concentration increases in inverse proportion to the melt amount.

The ingot was sliced into wafer substrates which were polished to a specular gloss sufficient for epitaxial deposition. A 3 μm thick epitaxial layer was deposited on the front surfaces of several wafer substrates using a chemical vapor deposition reactor such as an EPI CENTURA reactor manufactured by Applied Materials (Santa Clara, Calif., U.S.A.) or the EPSILON line of epitaxial reactors available from ASM (Bilthoven, Netherlands).

The OISF properties of the crystal were tested by heating several of the epitaxial silicon wafers to about 1100° C. for about 80 minutes in a wet atmosphere followed by a preferential etching with Wright etchant. Some of the heat treated wafers were subjected to a visual bright light inspection and no ring-like swirl pattern associated with OISF was visible. Laser surface inspection indicated an average concentration of OISF of about 0.5/cm² or less, far below what is considered the acceptable average concentration of about 10/cm². The highest concentration of OISF was 2.5/cm².

The oxygen precipitation properties of the crystal were tested by annealing several of the epitaxial wafers at about 800° C. for about 4 hours followed by 16 hours at 1000° C. in a nitrogen atmosphere. The results of the two-step annealing process are set forth in Table 1.

TABLE 1

Oxygen Precipitation Performance

| Position on Wafer | | Top of Ingot | Middle of Ingot | Bottom of Ingot |
|---|---|---|---|---|
| Pre-Precipitation Oxygen Concentration (ppma) | Center | 13.40 | 12.99 | 13.35 |
|  | 6 mm from edge | 10.18 | 9.35 | 9.75 |
| Post-Precipitation Oxygen Concentration (ppma) | Center | 0.30 | 0.35 | 0.42 |
|  | 6 mm from edge | 0.36 | 0.28 | 0.52 |
| Bulk Micro Defects (defects/cm³) | Center | $3.9 \times 10^8$ | $4.5 \times 10^8$ | $7.2 \times 10^8$ |
|  | 6 mm from edge | $4.8 \times 10^8$ | $5.5 \times 10^8$ | $8.5 \times 10^8$ |

The results indicate that the wafers are substantially free of epitaxial OISF and have an excellent intrinsic gettering ability (i.e., the concentration of BMDs exceed about $1 \times 10^8$/cm³) in spite of being subjected to an epitaxial deposition process. Also, the substantially nonuniform radial concentration of oxygen prior to being annealed resulted in a substantially uniform radial concentration of oxygen precipitates.

Comparative Example 1

Using the same crystal puller as used in Example 1, a single crystal ingot of p-type silicon having a diameter of about 200 mm and an {100} orientation was pulled from a 24 inch diameter crucible containing about 140 kg of polysilicon and about 160 mg of silicon nitride. The pulling rate was about 1.0 mm/min. The crucible rotation rate was controlled between about 6 rpm and about 9 rpm to yield an oxygen concentration of about 14±0.5 ppma along the axis of the ingot. The crystal rotation rate was about 12 rpm and the oxygen concentration over the length of the constant diameter portion at 6 mm from the edge was between about 14.5 to about 12.9 ppma. The radial gradient of oxygen concentration distribution was less than about 5%. The target nitrogen concentration at the top of the ingot was $3 \times 10^{13}$ atoms/cm³. The target nitrogen concentration at the bottom of the ingot was $11 \times 10^{13}$ atoms/cm³.

The ingot was sliced into wafers which were polished and 3 μm of epitaxial silicon was deposited. The OISF properties of the crystal were evaluated—bright light inspection revealed the typical OISF ring-like pattern and laser inspection indicated a concentration of OISF of about 130/cm².

The oxygen precipitation properties of the crystal were tested and are set forth in Table 2.

TABLE 2

Oxygen Precipitation Performance

| Position on Wafer | | Top of Ingot | Middle of Ingot | Bottom of Ingot |
|---|---|---|---|---|
| Pre-Anneal Oxygen Concentration (ppma) | Center | 14.15 | 13.79 | 14.07 |
|  | 6 mm from edge | 13.80 | 13.17 | 13.58 |
| Post-Anneal Oxygen Concentration (ppma) | Center | 0.39 | 0.27 | 0.67 |
|  | 6 mm from edge | 0.76 | 0.58 | 1.15 |
| Bulk Micro Defects (defects/cm³) | Center | $3.0 \times 10^8$ | $2.2 \times 10^8$ | $6.0 \times 10^8$ |
|  | 6 mm from edge | $1.2 \times 10^9$ | $8.5 \times 10^8$ | $2.5 \times 10^9$ |

The higher density of oxygen precipitates at the edges of the wafers indicates the presence of the H-band.

Example 2

A p⁻-type single crystal ingot of having a diameter of 300 mm and orientation {100} was pulled from a 32 inch crucible containing about 250 kg of polysilicon and about 600 mg of silicon nitride. The pulling rate was about 0.7 mm/min. The crucible rotation rate was controlled between about 4.5 rpm and about 6.5 rpm to yield an oxygen concentration of about 12.5±0.5 ppma at the center of the crystal. The crystal rotation rate was about 4 rpm and the oxygen concentration over the length of the constant diameter portion at 6 mm from the edge was between about 9.0 ppma to about 7.5 ppma. The radial gradient of oxygen concentration distribution was about 20% to about 40%. The target nitrogen concentration at the top of the ingot was $6 \times 10^{13}$ atoms/cm³. The target nitrogen concentration at the bottom of the ingot was $15 \times 10^{13}$ atoms/cm³.

The ingot was sliced into wafers which were polished to a specular gloss and a 2.5 μm thick epitaxial layer was deposited on the front surface of the wafer substrate. The OISF properties of the crystal were evaluated—bright light inspection revealed no OISF on the wafers and laser inspection indicated that the average concentration of OISF on the wafers was about $0.5/cm^2$ or less. The highest concentration of OISF was $1.5/cm^2$.

The oxygen precipitation properties of the crystal are set forth in Table 3.

TABLE 3

| | Oxygen Precipitation Performance | | | |
|---|---|---|---|---|
| Position on Wafer | | Top of Ingot | Middle of Ingot | Bottom of Ingot |
| Pre-Anneal Oxygen Concentration (ppma) | Center | 12.63 | 12.07 | 12.23 |
| | 6 mm from edge | 8.52 | 7.9 | 8.00 |
| Post-Anneal Oxygen Concentration (ppma) | Center | 0.26 | 0.21 | 0.32 |
| | 6 mm from edge | 0.38 | 0.29 | 0.45 |
| Bulk Micro Defects (defects/cm³) | Center | $2.5 \times 10^8$ | $1.7 \times 10^8$ | $3.4 \times 10^8$ |
| | 6 mm from edge | $2.8 \times 10^8$ | $2.1 \times 10^8$ | $4.2 \times 10^8$ |

The results indicate that the 300 mm wafers are substantially free of epitaxial OISF and have an excellent intrinsic gettering ability (i.e., the concentration of BMDs exceed about $1\times10^8/cm^3$) in spite of being subjected to an epitaxial deposition process. Also, the substantially nonuniform radial concentration of oxygen prior to being annealed resulted in substantially uniform radial concentration of oxygen precipitates.

In view of the above, it will be seen that the several objects of the invention are achieved. As various changes could be made in the above compositions and processes without departing from the scope of the invention, it is intended that all matter contained in the above description be interpreted as illustrative and not in a limiting sense.

What is claimed is:

1. A process for growing a single crystal silicon ingot in which the ingot comprises a central axis, a seed end, an opposite end and a constant diameter portion between the seed end and the opposite end having a lateral surface, a radius, R, extending from the central axis to the lateral surface and a nominal diameter of about D mm, the ingot being grown from a silicon melt in a crucible and then cooled from the solidification temperature in accordance with the Czochralski method, the process comprising:

growing the constant diameter portion of the crystal at a rate, v, to cause the formation of an axially symmetrical region in which vacancies are the predominant intrinsic point defect, the axially symmetric region being generally cylindrical in shape and having a radius, $r_{as}$, extending from the central axis wherein $r_{as}$ is at least about 0.95 R and a length as measured along the central axis of at least about 20% of the length of the constant diameter portion of the ingot;

rotating the crucible and the ingot in opposite directions during the formation of the axially symmetric region at rates $R_{melt}$ and $R_{ingot}$, respectively, to incorporate between about 7 ppma and about 10.5 ppma of oxygen at about 5-6 mm inward of the lateral surface; and doping the silicon melt with nitrogen so that about $1\times10^{13}$ nitrogen atoms/cm³ to about $1\times10^{15}$ nitrogen atoms/cm³ are incorporated into the ingot during the formation of the axially symmetric region.

2. The process as set forth in claim 1 wherein the length of the axially symmetric region is at least about 40% of the length of the constant diameter portion of the ingot.

3. The process as set forth in claim 1 wherein the length of the axially symmetric region is at least about 60% of the length of the constant diameter portion of the ingot.

4. The process as set forth in claim 1 wherein the length of the axially symmetric region is at least about 80% of the length of the constant diameter portion of the ingot.

5. The process as set forth in claim 1 wherein the length of the axially symmetric region is at least about 90% of the length of the constant diameter portion of the ingot.

6. The process as set forth in claim 1 wherein the length of the axially symmetric region is at least about 100% of the length of the constant diameter portion of the ingot.

7. The process as set forth in claim 1 wherein v is at least about 0.7 mm/min.

8. The process as set forth in claim 7 wherein D is 150.

9. The process as set forth in claim 7 wherein D is 200.

10. The process as set forth in claim 7 wherein D is 300.

11. The process as set forth in claim 7 wherein $R_{melt}$ is at least about 2-3 rpm.

12. The process as set forth in claim 11 wherein $R_{ingot}$ is less than about 1600/D rpm.

13. The process as set forth in claim 11 wherein $R_{ingot}$ is about 600/D rpm to about 1600/D rpm.

14. The process as set forth in claim 11 wherein $R_{ingot}$ is about 750/D rpm to about 1500/D rpm.

15. The process as set forth in claim 11 wherein $R_{ingot}$ is about 1200/D rpm.

16. The process as set forth in claim 7 wherein $R_{melt}$ is at about 4 rpm to about 10 rpm.

17. The process as set forth in claim 7 wherein $R_{melt}$ is at about 5 rpm to about 8 rpm.

18. The process as set forth in claim 1 wherein v is at least about 0.9-1.0 mm/min.

* * * * *